US00RE37228E

(19) United States
(12) Reissued Patent
Fuse et al.

(10) Patent Number: US RE37,228 E
(45) Date of Reissued Patent: Jun. 12, 2001

(54) METHOD OF FABRICATING SEMICONDUCTOR DEVICE

(75) Inventors: Genshu Fuse, Hirakata; Takashi Ohzone, Yawata, both of (JP)

(73) Assignee: Matsushita Electric Industrial Co., Ltd., Osaka (JP)

( * ) Notice: This patent is subject to a terminal disclaimer.

(21) Appl. No.: 08/136,241

(22) Filed: Oct. 15, 1993

Related U.S. Patent Documents

Reissue of:
(64) Patent No.: 5,057,444
Issued: Oct. 15, 1991
Appl. No.: 07/467,544
Filed: Jan. 19, 1990

U.S. Applications:

(63) Continuation of application No. 07/191,788, filed on Apr. 27, 1988, now Pat. No. 4,918,027, which is a continuation of application No. 06/836,514, filed on Mar. 5, 1986, now abandoned.

(30) Foreign Application Priority Data

Mar. 5, 1985 (JP) ..... 60-43121

(51) Int. Cl.[7] ..... H01L 21/425
(52) U.S. Cl. ..... 438/524; 438/247; 438/390; 438/433
(58) Field of Search ..... 437/27, 28, 35, 437/36, 38; 438/246, 247, 389, 390, 433, 524

(56) References Cited

U.S. PATENT DOCUMENTS 4,653,177 * 3/1987 Lebowitz et al. ..... 437/35
4,756,793 * 7/1988 Peek ..... 437/35

FOREIGN PATENT DOCUMENTS 63-227017 * 9/1988 (JP) ..... 437/35

OTHER PUBLICATIONS

Nakamura et al., "Buried Isolation Capacitor (BIC) Cell for Megabit Mos Dynamic RAM," IERDM 1984, pp 236–239.*
Nikkei Microdevices, No. 8, 1994, pp 38–39.*
Fuse et al., "Indirect Trench Sidewal Doping by Implantion of Reflected Ions", Applied Physics Letters, Apr. 17, 1989. pp 1534–1536.*

* cited by examiner

*Primary Examiner*—Kevin M. Picardat
(74) *Attorney, Agent, or Firm*—Wenderoth, Lind & Ponack, L.L.P.

(57) ABSTRACT

A method of fabricating a semiconductor device comprising a step of forming a trench selectively on a semiconductor substrate, a step of positioning said semiconductor substrate to a first position inclined to a plane vertical to ion beams, a step of injecting ions by emitting ion beams to a side-wall of the trench of the semiconductor substrate at the first position, a step of positioning said semiconductor substrate to a second position which is different from the first position by rotating it, and a step of injecting ions by emitting ion beams to a side-wall of the trench of the semiconductor substrate at the second position.

3 Claims, 9 Drawing Sheets

METHOD OF FABRICATING SEMICONDUCTOR DEVICE

Matter enclosed in heavy brackets [ ] appears in the original patent but forms no part of this reissue specification; matter printed in italics indicates the additions made by reissue.

This application is a continuation of application Ser. No. 07/191,788, filed Apr. 27, 1988, now U.S. Pat. No. 4,918,027 which in turn is a continuation of application Ser. No. 836,514 filed Mar. 5, 1986, now abandoned.

BACKGROUND OF THE INVENTION

This invention relates to a method of fabricating a semiconductor device, and more particularly, to a method of forming trench isolation between elements in a semiconductor device without humps in subthreshold current regions.

Many non LOCOS isolation techniques have been reported to realize submicron isolation in a semiconductor device (T. Shibata et al., IEDM Tech. Dig., pp. 27–30, Dec. 1983; K. Terada et al., IEEE Trans. on Electron Devices, Vol. ED-31, pp. 1308–1313, Sept. 1981). Above all, the trench isolation technique with buried oxide is thought of as a leading technique. However, n-MOS FETs fabricated with the trench isolation frequently show humps in subthreshold current regions and a reverse narrow width effect in threshold voltages (T. Iizuka et al., IEDM Tech. Dig., pp. 380–383, Dec. 1981). In order to eliminate these disadvantages, increasing boron concentration at side-walls of channel edges seems to be effective. For implanting boron ions into the side-walls, tapered etching of the isolation side-walls in a silicon substrate was proposed (Kurosawa et al., IEDM Tech. Dig., pp. 384 Dec. 1981). That is, V-letter-shaped isolation is used to increase boron concentration at side-walls thereof. However, the minimum isolation width $W_I$ may be limited by 2D tan $\alpha$, where D and $\alpha$ are isolation depth and taper angle, respectively. For example, $W_I$ is limited to be about 0.69 $\mu$m for D=0.6 $\mu$m and $\alpha$=60°.

SUMMARY OF THE INVENTION

The present invention, therefore, has as its principal object the provision of an improved method of forming trench isolation for a semiconductor device in which vertical side-walls are used instead of tapered side-walls and which can suppress the hump currents and control the narrow width effect.

Another object of the invention is to provide an improved method of forming trench isolation for a semiconductor device which may be applicable to submicron isolation width of below 0.5 $\mu$m.

These and other objects are accomplished by a method of fabricating a semiconductor device which comprises a step of forming a trench selectively on a semiconductor substrate, a step of positioning said semiconductor substrate in a first position inclined to a plane vertical to ion beams, a step of implanting ions by emitting ion beams to a side-wall of the trench of the semiconductor substrate at the first position, a step of positioning said semiconductor substrate in a second position which is different from said first position by rotating it, and a step of injecting ions by emitting ion beams to a side-wall of the trench of the semiconductor substrate at the second position.

In an illustrated embodiment, ions to be implanted are boron. In ion implantation of n times, the angle of rotation of the semiconductor substrate of each time is substantially an integer multiple of 360°/n. The trench possesses four vertical side-walls which substantially contact with each other at 90°, and a bottom which contacts with each side-wall substantially at 90°. Ions are implanted into the bottom of trench by emitting ion beams in the direction perpendicular to the surface of the semiconductor substrate. The side-walls are implanted by orienting a normal of a plane containing the surface of the semiconductor at an angle of inclination of substantially 8° to the direction of the implanting ions. The semiconductor substrate is a semiconductor wafer.

This invention also relates to a method of fabricating a semiconductor device which comprises a step of forming a trench having four vertical side-walls contacting at 90° and a bottom selectively on a semiconductor substrate, a step of positioning the semiconductor substrate while emitting ion beams onto a first side-wall of said semiconductor substrate from a direction inclined to the normal of a plane which contains the principal surface of said semiconductor substrate, a step of implanting ions into said first side-wall by emitting ion beams onto said side-wall, a step of, positioning the semiconductor substrate while emitting said ion beams onto a second side-wall which adjoins said first side-wall by rotating said semiconductor substrate by 90°, a step of implanting ions into said second side-wall by emitting ion beams onto said second side-wall, a step of positioning the semiconductor substrate while emitting said ion beams onto a third side-wall which adjoins said second side-wall by rotating said semiconductor substrate by 90°, a step of implanting ions into said third side-wall by emitting ion beams onto said third side-wall, a step of positioning the semiconductor substrate while emitting said ion beams onto a fourth side-wall which adjoins said third side-wall by rotating said semiconductor substrate by 90°, and a step of implanting ions onto said fourth side-wall by emitting ion beams onto said fourth side-wall.

This invention further relates to a method of fabricating a semiconductor device which comprises a step of forming a trench on a semiconductor substrate, a step of emitting ion beams to the principal plane of said semiconductor substrate from an oblique direction, a step of changing the relative positions of ion beams and semiconductor substrate after a first ion beam irradiation, and a step of emitting ion beams a second time after changing position, whereby ions are implanted into the side-walls of the trench.

According to the present invention as described herein, the following benefits, among others, are obtained:

(1) Ions can be easily implanted into untapered vertical side-walls and generation of hump currents can be prevented, so that a semiconductor device of high density and excellent properties can be provided.

(2) Besides, since a submicron isolation width below 0.5 $\mu$m can be achieved, a semiconductor device of high precision can be manufactured.

While the novel features of the invention are set forth with particularly in the appended claims, the invention, both as to organization and content, will be better understood and appreciated, along with other objects and features thereof, from the following detailed description taken in conjunction with the drawing, in which:

DETAILED DESCRIPTION OF THE INVENTION

One example of a method of making a semiconductor device according to the invention is explained hereinafter with reference to FIGS. 1 to 3.

This embodiment may be summarized as follows.

As a device isolation area in a p-type (100) wafer 10, a U-section trench 24 is etched to a depth of about 0.6 $\mu$m by reactive ion etching using $CCl_4$ gas, and the wafer is fixed such that the normal of a plane containing principal surface of the wafer is inclined at an angle of 8° to the direction of the ion beams to be implanted, and boron is implanted to a level of 0.2 to $2\times10^{13}cm^{-2}$ boron ions at 108 keV. Thereafter, the wafer is rotated by 90° in said plane and fixed, and ion implantation is effected again under the same conditions. The wafer is further rotated by 90°, and the same ion implantation is repeated. Thus by rotating the wafer by 90° each time, four ion implantations are effected in total.

Figure 1:
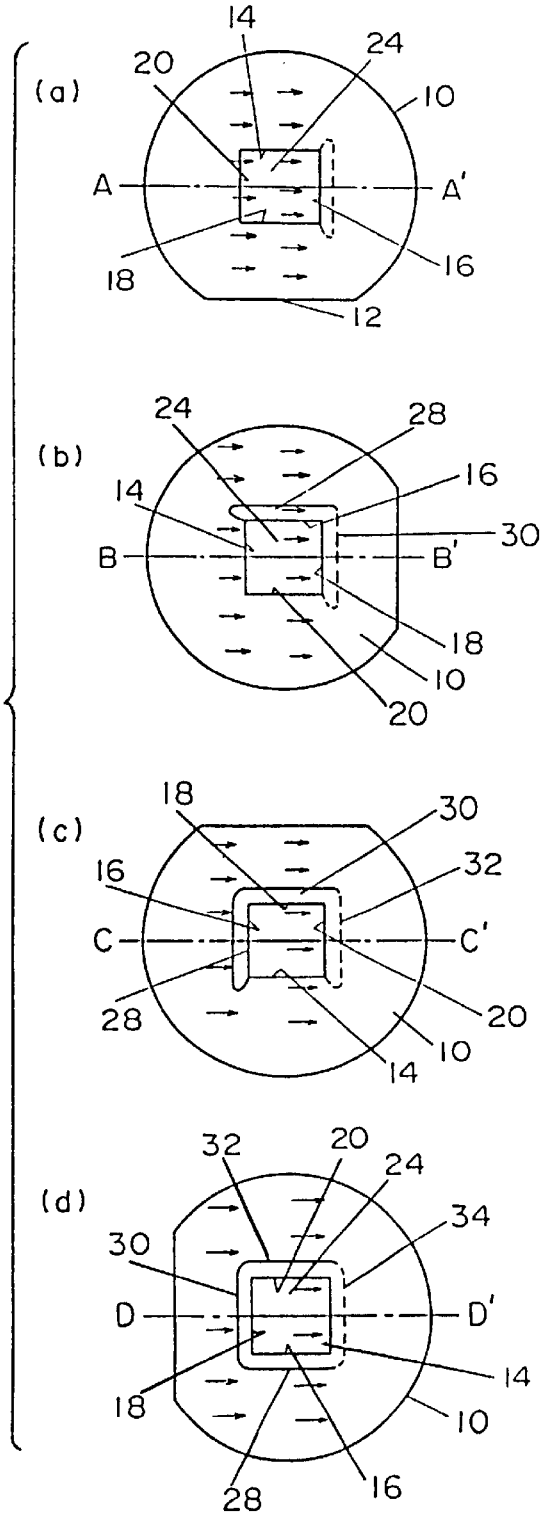
FIGS. 1(a)–1(d) are plan views of a semiconductor device for explaining one example of a method of making a semiconductor device according to the present invention.
Figure 2:
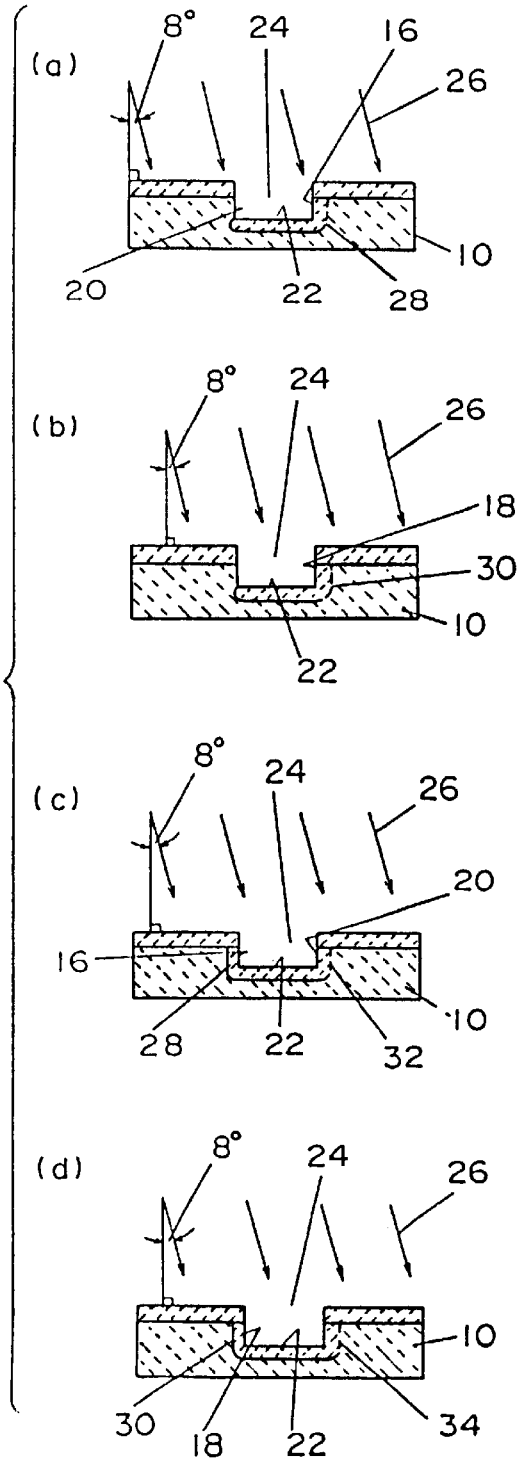
FIGS. 2(a)–2(d) are sectional views of the semiconductor device taken along the lines A—A', B—B', C—C', D—D' of FIGS. 1(a)–1(d), respectively.
Figure 3:
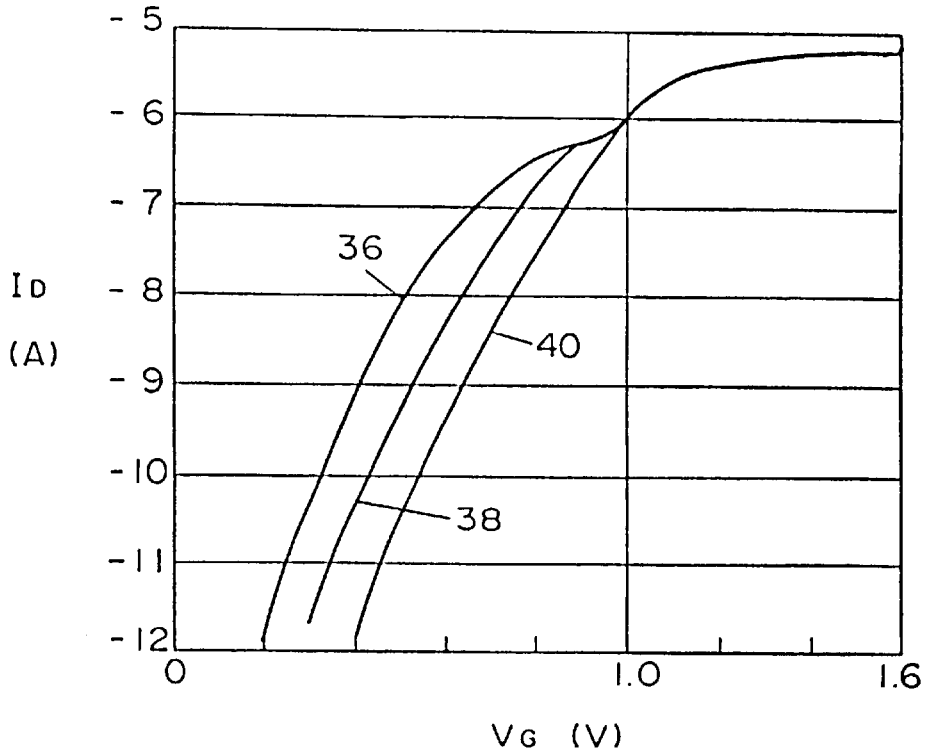
FIG. 3 is a graph which shows a characteristic of subthreshold current of the semiconductor device.

This embodiment is further described while with reference to FIGS. 1, 2. FIG. 1(a) is a top view of a wafer 10, in which a straight edge 12 of the wafer 10 is seen at the lower end. FIG. 2(a) is a cross section along line A—A' of FIG. 1(a), in which is shown the square trench 24 composed of four side-walls 14, 16, 18, 20 which contact with each other at a 90° angle, and a bottom 22 which contacts with each side-wall at a 90° angle. These side-walls 14, 16, 18, 20 are formed at a right angle to the top surface of wafer 10, whereas the bottom 22 is formed parallel to the top surface. As shown in FIGS. 1(a), 2(a), a first position of the wafer 10 is determined so that boron ion beams 26 can be emitted onto the wafer 10 at an inclination of 8° from the normal to a plane parallel to the top of the wafer 10, the normal being parallel to the side-wall 16. In this case, the ion beams 26 are parallel to the opposite side-walls 14, 18 confronting the trench 24. These ion beams 26 are injected into the top of wafer 10, bottom 22 of the trench 24 and its one side-wall 16, and an implanted region 28 is formed on the side-wall 16. After formation of the implanted area 28, irradiation of ion beams 26 is stopped.

In the next step, as shown in FIG. 1(b), the wafer 10 is rotated by 90° about a rotation axis parallel to the normal of the top of the wafer and fixed in a second position. Then irradiation of boron ion beams 26 is started again. In this case, the ion beams 26 are parallel to the opposite side-walls 16, 20 of the trench 24. By similarly injecting ion beams 26, an implanted region 30 is formed on the side-wall 18 of the trench 24. In FIG. 1(c), the wafer 10 is further rotated by 90° about its axis of rotation to a third position, and ions are similarly injected to form an implanted region 32 on the next side-wall 20. Finally, as shown in FIG. 1(d), the wafer 10 is rotated 90° about its axis of rotation to a fourth position, and ions are similarly injected to form an implanted region 34 on the side-wall 14 of the trench 24. As a result, boron ions are implanted into all the side-walls of the trench. In this way, the sample was prepared. By way of comparison, without inclining the wafer, another sample was placed at a right angle to the ion beams, and implanted with $2\times10^{13}cm^{-2}$ boron ions at 108 keV. That is, a control sample without any ion injection on the isolated side-walls was prepared.

Using these samples, a deposited oxidation film was buried in the isolation trench, and a MOS transistor of n channels was formed in a specified area of the substrate. In a sample with a channel width of 2 $\mu$m and a channel length of 5 $\mu$m, the relationship between gate voltage $V_G$ and subthreshold current $I_D$ is shown in FIG. 3.

Numeral 36 indicates a curve for ion implantation without wafer inclination, while 38 and 40 denote curves for this embodiment after ion implantation by wafer inclination. More specifically, curve 38 represents the characteristic after injection of $0.1\times10^{13}cm^{-2}$ boron ions at an inclination angle of 8°, and curve 40 is the characteristic after injection of 0.25 to $2\times10^{13}cm^{-2}$ boron ions at 8°. The substrate voltage was −1 V, and the hump property was emphasized. As is clear from this diagram, the hump property was eliminated when the injection exceeded $2.5\times10^{12}cm^{-2}$.

In this embodiment, incidentally, the wafer 10 was rotated in planarity four times by 90° each time, but it is known that a sufficient effect is obtained if rotated twice by 180° each time, at least. Besides, in a trench type capacitor, among dynamic RAM cell capacitors, by employing this ion implantation technique, impurities can be doped into all side-walls of the deep trench.

This embodiment enables formation of a transistor without a hump, especially an n-channel MOS, by fixing the wafer position so that ion beams can get into a first channel side-wall, implanting ions, rotating the wafer so that ion beams can get into another channel side-wall, and repeating ion implantations and wafer rotations so that all channel side-walls can be implanted with nearly equal concentrations of ions.

Furthermore in an ordinary LSI pattern which is usually formed in a 90° direction, or very rarely in a 45°, when the wafer is rotated four times by 90° each time or eight times by 45° each time to implant ions, almost all side-walls of the trench can be implanted with ions.

In addition, the bottom of the trench can also be implanted by additional ion injection of vertical (0° inclination) ion beams oriented perpendicularly to the surface forming the top surface of the semiconductor substrate, so that ions sufficient for isolation of elements can be doped.

Another example is explained with reference to FIGS. 4–8.

Figure 4A:
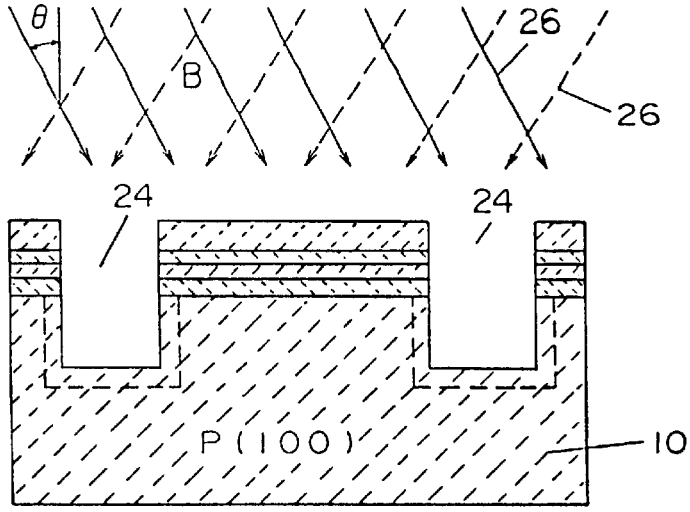
FIGS. 4(a)–4(d) are sectional views of second a example of the method according to the invention.
Figure 4B:
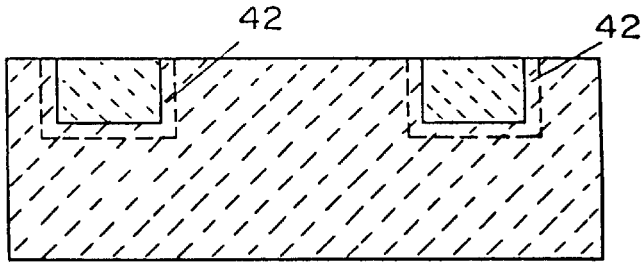
Figure 4C:
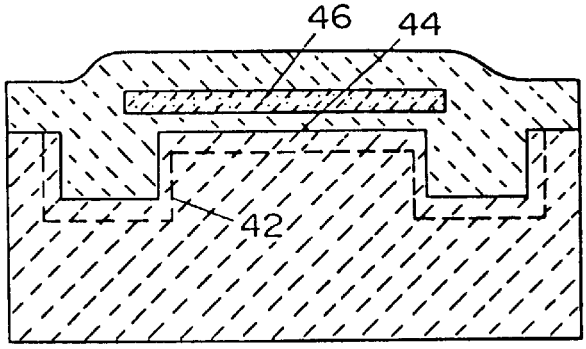
Figure 4D:
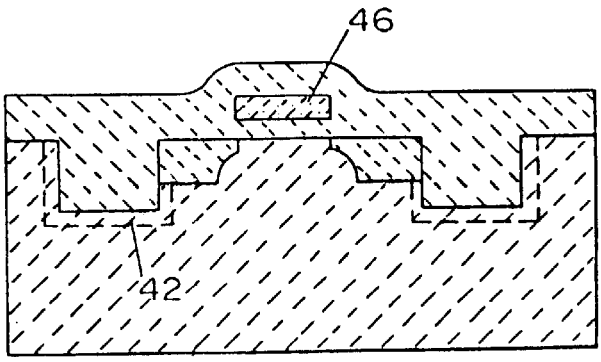

FIGS. 4(a)–4(d) show cross sectional views of the process sequence. In FIG. 4(a), $SiO_2/Si_3N_4/SiO_2$ films are formed on p-type (100) silicon substrate 10 of about 10 Ω.cm. Then, the silicon substrate 10 is etched by a reactive ion etching technique to form the trenches 24 of 0.6 $\mu$m depth. Channel stop boron atoms are implanted into each side-wall keeping the implantation angle θ set at 0° and 8°. For implanting into the side-walls as shown by the arrow marks, the silicon substrate is rotated during implantation. In FIG. 4(b), LPCVD $SiO_2$ films 42 are deposited and etched back for planarization of the trench isolation regions. Then, gate oxide 44 of 20 nm is grown and $n^+$-polysilicon gate electrodes 46 with $SiO_2$ side-walls of about 250 nm thickness are formed to fabricate LDD n-MOS FETs. FIG. 4(c) and (d) show channel width and length directional cross sectional views of the FETs, respectively.

Figure 5B:
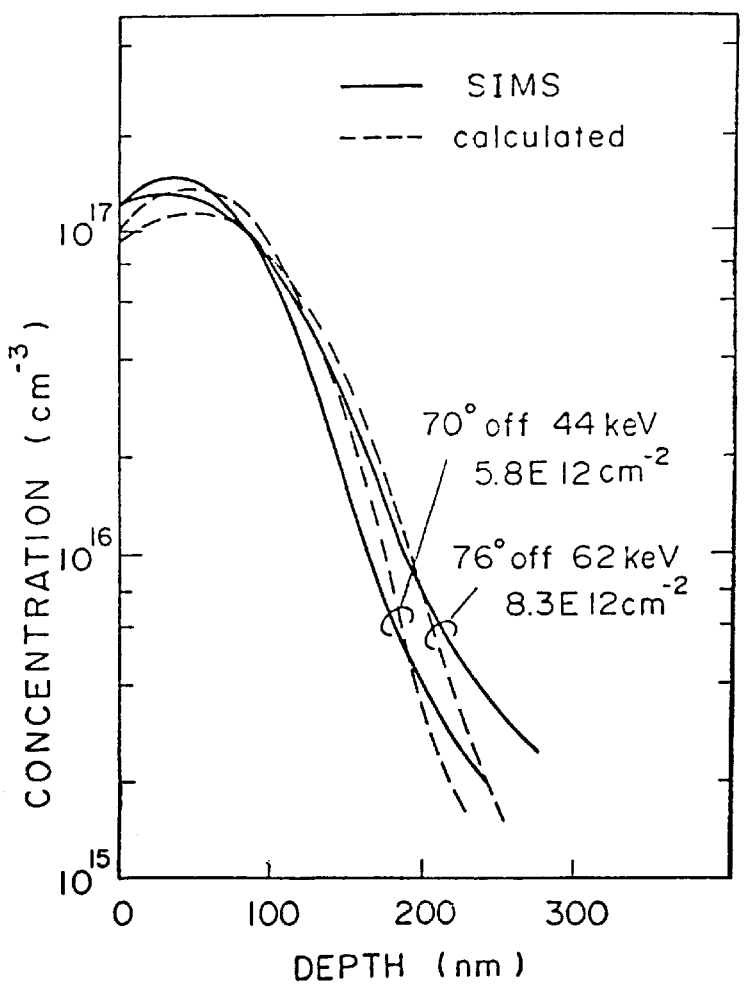
FIGS. 5(a) and 5(b) are diagrams which show the depth profiles of as-implanted boron atoms measured by SIMS.
Figure 5A:
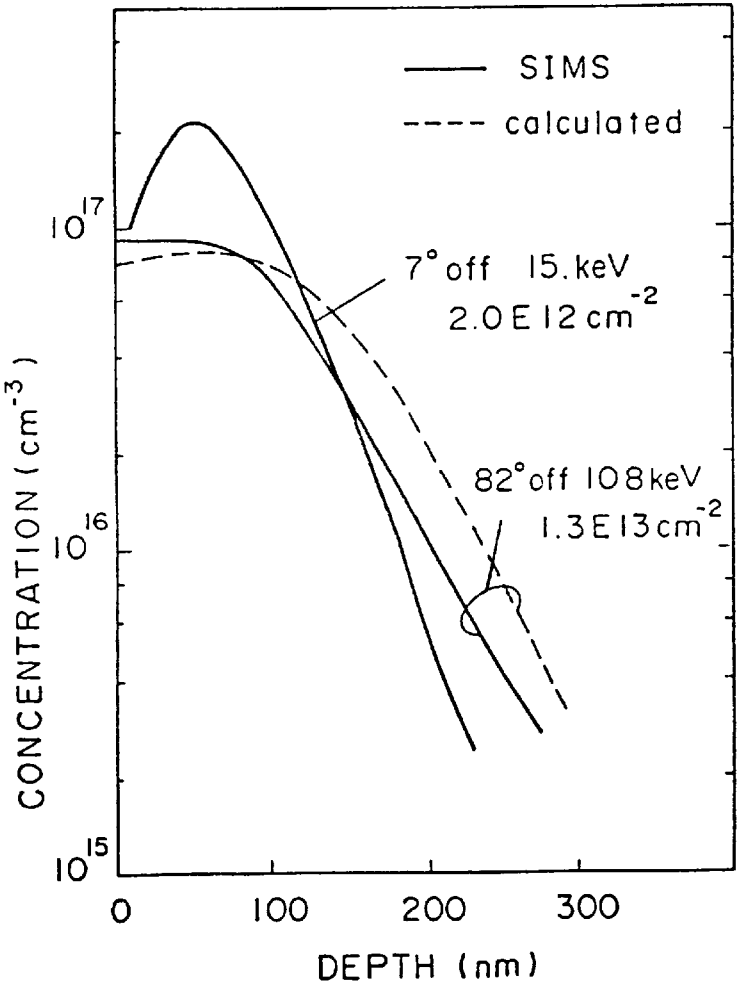

FIGS. 5(a) and (b) show the depth profiles of as-implanted boron atoms measured by SIMS. Samples are implanted under the conditions of tilting angles of 82°, 76°, 70°, which are equivalent to the side-wall implantation angles θ of 8°, 14°, 20°, respectively. The energies (doses) of 108 keV ($1.3\times10^{13}$), 62 keV ($8.3\times10^{12}$) and 44 keV ($5.8\times10^{12}$) were calculated by assuming a lowering or reduction factor of sin θ from the conventional condition of 15 keV ($2\times10^{12}$) at 7° inclination. The profiles are not so different from the conventional 7° inclination profile except near the surface regions. The differences may be due to the forward scattering effect. FIGS. 5(a) and (b) suggest about half of the incident boron atoms scatter out from the surfaces. The dotted lines show two-dimensional simulated profiles including the scattering effect near the surfaces. Both profiles are in good agreement with each other.

Figure 6A:
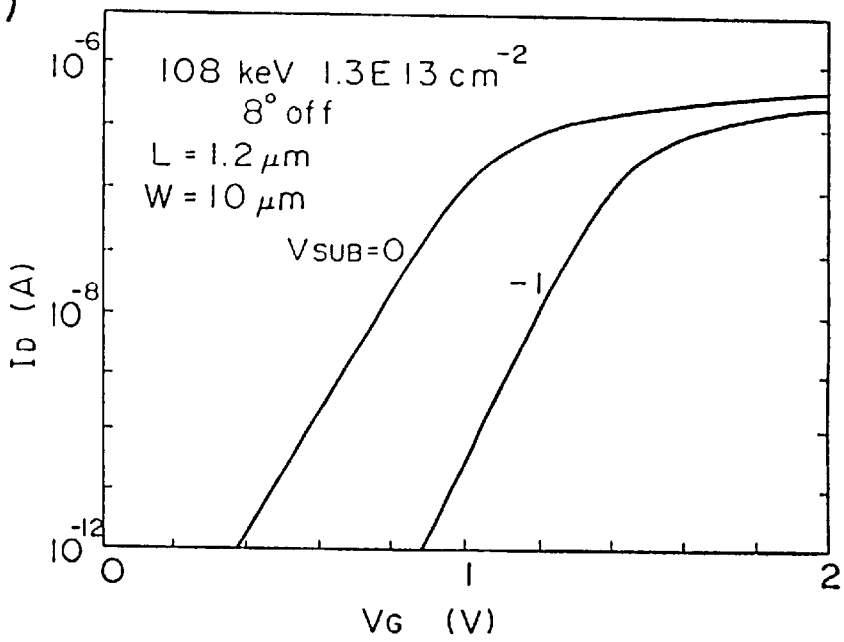
FIGS. 6(a) and 6(b) are graphs which show subthreshold current characteristics, FIG. 6(a) showing the characteristics where ions are implanted into side-walls at 8°, and FIG. 6(b) showing the characteristics where ions are implanted at 0°.
Figure 6B:
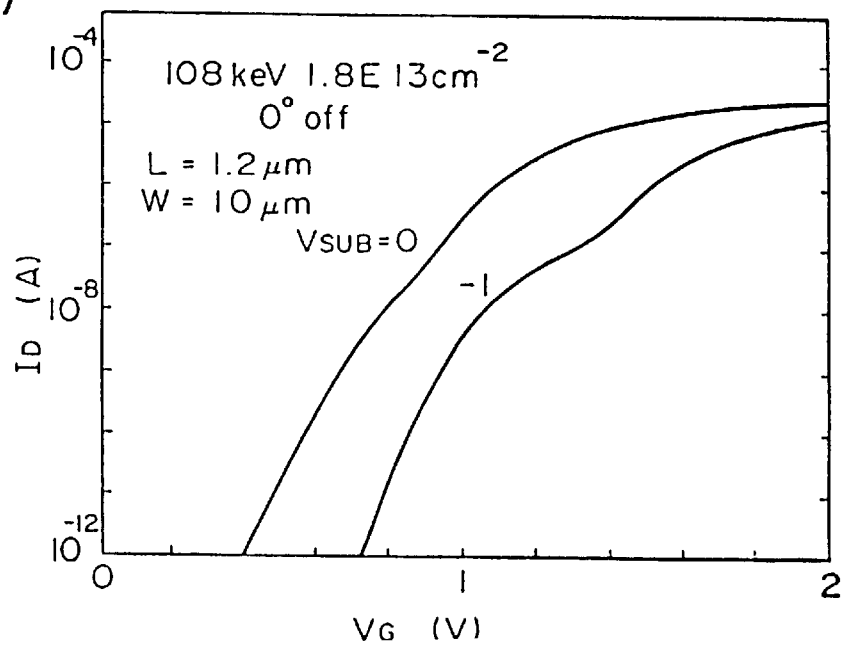

FIGS. 6(a) and 6(b) show subthreshold current characteristics as a parameter of substrate voltages $V_{SUB}$ of 0 and −1 V. The sample shown in FIG. 6(a) was implanted into side-walls at 8° inclination. However, the sample shown in FIG. 6(b) was implanted at 0° inclination, resulting in boron implantation only at the bottom of the trench. Hump currents are completely suppressed by tilted implantation.

Figure 7A:
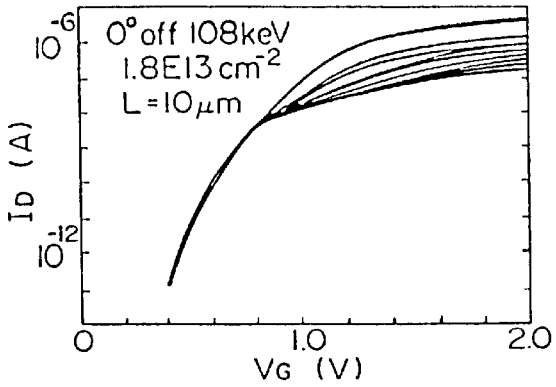
FIGS. 7(a) and 7(b) are graphs which show the channel width dependencies of subthreshold current regions of the samples with and without humps.
Figure 7B:
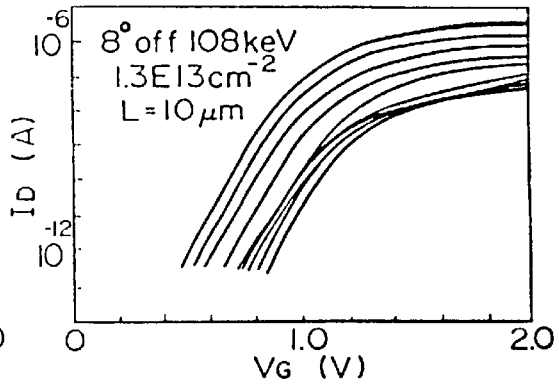
Figure 7C:
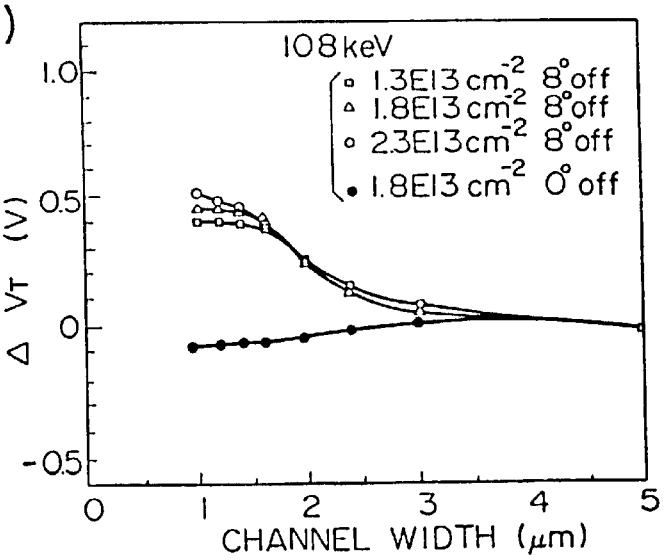
FIG. 7(c) is a graph which shows narrow width effects and FIG. 7(d) is a graph which shows the dose dependence of narrow width effect factor $\Delta V_{TW}$.
Figure 7D:
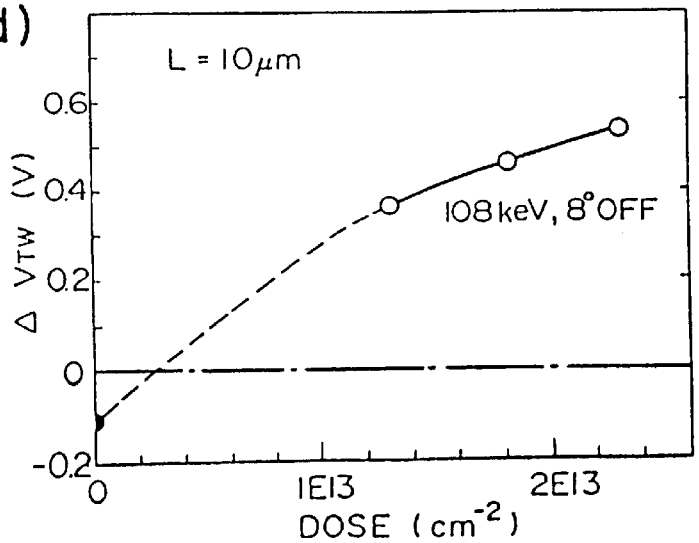

FIGS. 7(a) and (b) show the channel width dependents of subthreshold current regions of the samples with and without humps, respectively. Mark X shows threshold voltages $V_T$ at drain currents $I_D$=0.1 (W/L) μA, where W and L are channel width and length, respectively. In the case of the sample shown in FIG. 7(a), $V_T$ decreases as W decreases because of hump currents, resulting in reverse narrow width effect. But, the sample shown in FIG. 7(b) with side-wall implantation shows conventional narrow width effect similar to that of LOCOS samples. FIG. 7(c) shows narrow width effects of these samples. $V_T$'s are normalized to $V_T$ at W of 5 μm. FIG. 7(d) shows narrow width effect factor $\Delta V_{TW}$ (the difference between threshold voltages of channel width of 1 μm and 5 μm) versus implantation doses of a side-wall. It shows that the side-wall implantation are very useful for controlling the narrow width effects and for suppressing the hump currents.

Figure 8:
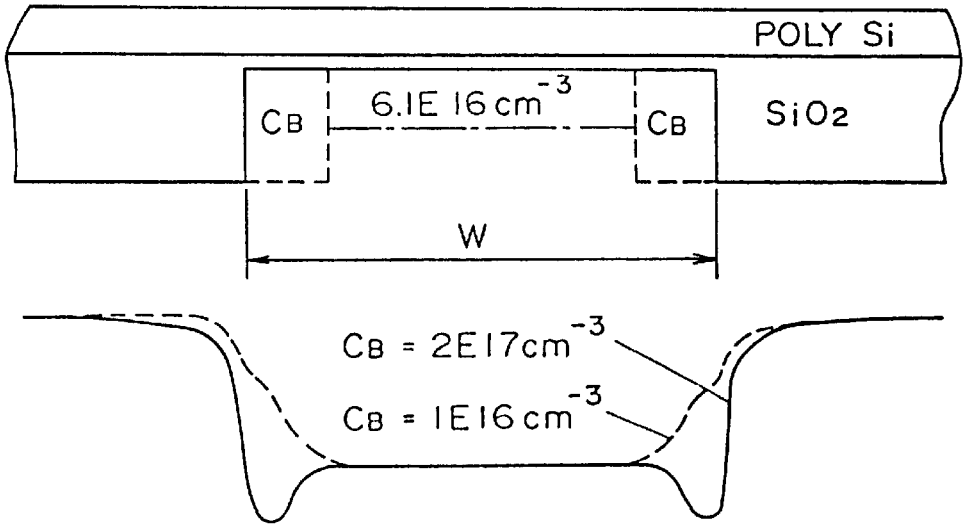
FIG. 8 is a diagram which shows surface potential distribution for samples of the side-wall boron concentrations of $2\times10^{17}$ and $1\times10^{16}cm^{-3}$.
Figure 9A:
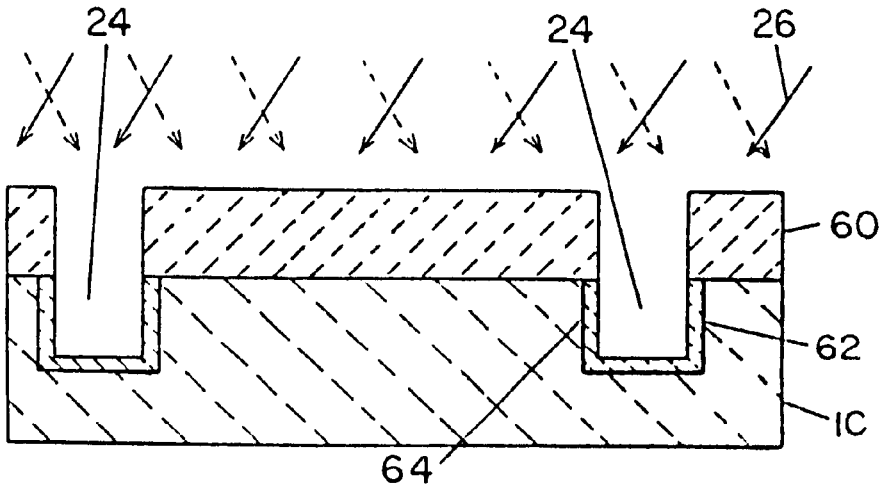
FIGS. 9(a)–9(d) are sectional views showing another example of the method of fabricating a semiconductor device according to the invention.
Figure 9B:
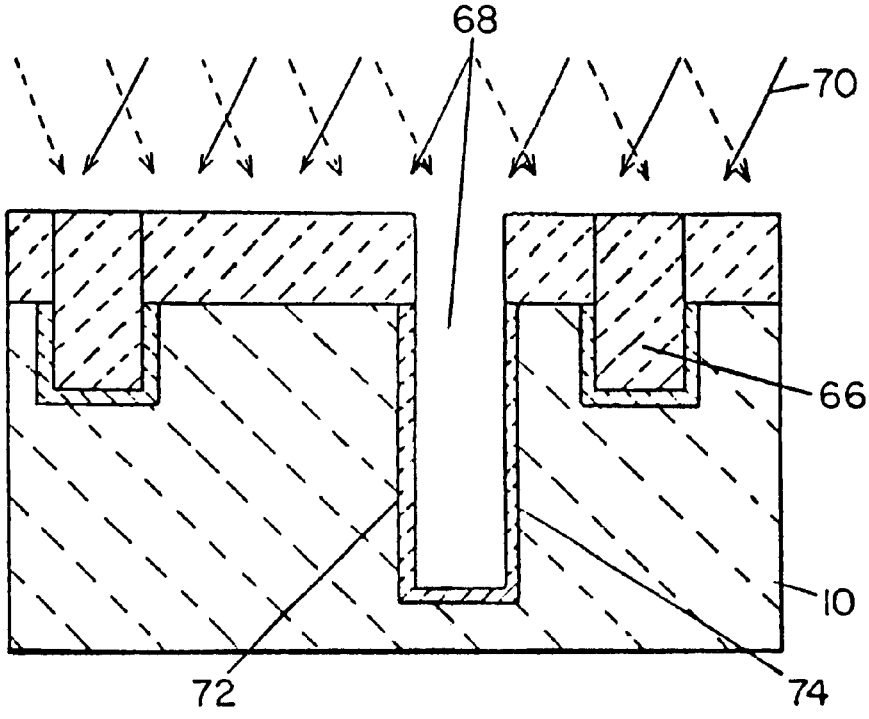
Figure 9C:
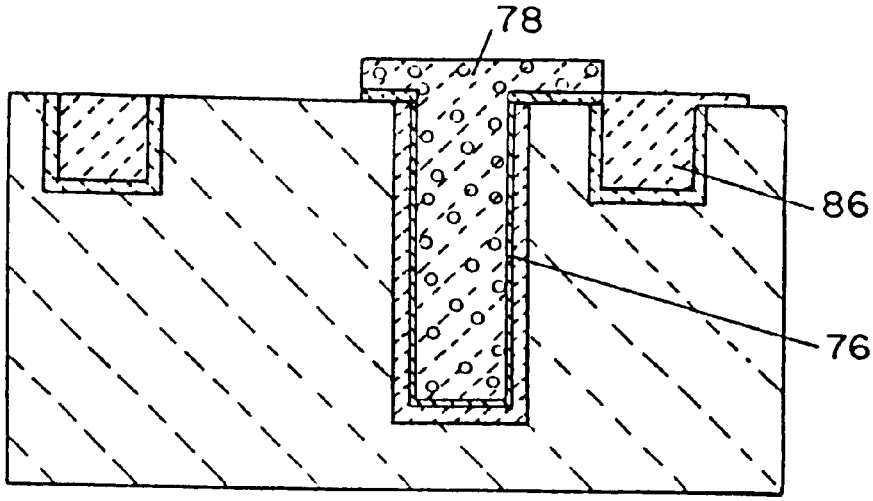
Figure 9D:
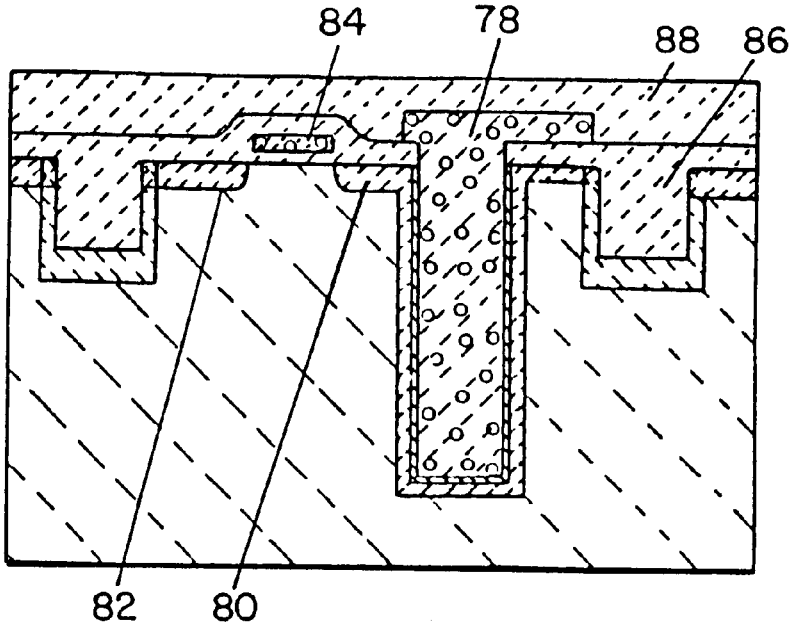

FIG. 8 shows surface potential distributions derived from a MOS device having a two-dimensional simulator for two side-wall boron concentrations of $2\times10^{17}$ and $1\times10^{16}cm^{-3}$. Optimum side-wall concentrations may be calculated by the simulator.

The limitation of isolation width $W_I$ set by the technology is given by $W_I=D_T \tan\theta$ where $D_T$ is the total depth of the trench at the implant stage as shown in FIG. 4(a). In experiments, thicknesses of resist film, $SiO_2/Si_3N_4/SiO_2$ films, and depth of trench isolation in the silicon substrate are about 0.6 μm, 0.3 μm, and 0.6 μm, respectively. $W_I$ is calculated to be about 0.2 μm for θ=8° and $D_T$=1.5 μm. The technology is applicable to achieve submicron vertical isolation.

In the above embodiment, meanwhile, the irradiation direction of ion beams was fixed and the wafer 10 was rotated, but it is obvious that a similar effect may be obtained by fixing the wafer 10 and varying the irradiation angle of the ion beams. An intermittent rotating mechanism for the wafer 10 or varying mechanism of the irradiation direction of the ion beam can be easily manufactured on the basis of any known mechanism, and detailed descriptions are omitted in this explanation.

Referring now to FIG. 9, a method of producing one cell of a dynamic RAM in one of the embodiments of this invention is explained herein. In the step shown in FIG. 9(a), an isolation trench 24 is etched into a $SiO_2$ mask 60. Boron ions are injected by means of boron ion beams 26 into all walls which makes up the isolation trench 24, and $p^+$ regions 62, 64 are formed. In the step shown in FIG. 9(b), a deep trench 68 is formed by deeply etching into an Si substrate 10 under the condition that the isolation trench 24 is masked (66). Then $As^+$ ion beams 70 are emitted to all walls to form the deep trench 68, and $As^+$ ions are doped. In succession, to form one of the electrodes of the capacitor, n-type regions 72, 74 are formed. In the next step shown in FIG. 9(c), a thin insulation film 76 is formed on the inner wall of the deep trench 68, and the other electrode 78 of the capacitor is formed by doped polysilicon. In the step shown in FIG. 9(d), a MOS transistor is formed, and a source 80, a drain 82, and a gate electrode 84 are formed, thereby making up one cell of a dynamic RAM. Also shown are an isolation region 86 and a protective oxide layer 88.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

We claim:

1. A method of fabricating a semiconductor device comprising:

a step of forming a trench in a semiconductor substrate having a principal surface, said trench having four side-walls which extend into said substrate in a direction [substantially] perpendicular to said principal surface of said semiconductor substrate and which are perpendicular to each other, and said trench having a bottom [substantially] parallel to said principal surface;

a step of positioning said semiconductor substrate in a first position;

a step of implanting ions into a first side-wall of said side-walls of said trench from a direction inclined to a normal to a plane containing said principal surface of said semiconductor substrate;

a step of positioning said semiconductor substrate in a second position which is different from said first position by rotating said semiconductor substrate by 90° about an axis of rotation which is perpendicular to said principal surface of said semiconductor substrate;

a step of implanting ions of the same type and to the same extent as implanted in the first side-wall into a second side-wall of said side-walls of said trench from said direction inclined to the normal to the plane containing said principal surface of said semiconductor substrate;

a step of positioning said semiconductor substrate in a third position which is different from said first and second positions by rotating said semiconductor substrate by 90° about said rotation axis;

a step of implanting ions of the same type and to the same extent as implanted in said first and second side-walls into a third side-wall of said side-walls of said trench from said direction inclined to the normal to the plane containing said principal surface of said semiconductor substrate;

a step of positioning said semiconductor substrate in a fourth position which is different from said first, second and third positions by rotating said semiconductor substrate by 90° about said rotation axis;

a step of implanting ions of the same type and to the same extent implanted in said first, second and third side-walls into a fourth side-wall of said side-walls of said trench from said direction inclined to the normal to the plane containing said principal surface of said semiconductor substrate; and a step of implanting ions into the bottom of the trench by emitting ion beams of the same type as implanted in the side-walls in a direction perpendicular to said principal surface of said semiconductor device.

2. A method of fabricating a [semiconductor device] *trench capacitor* comprising:

a step of forming a trench in a semiconductor substrate having a principal surface, said trench having four side-walls which extend into said substrate in a direction [substantially] perpendicular to said principal surface of said semiconductor substrate and which are perpendicular to each other, and said trench having a bottom [substantially] parallel to said principal surface;

*a step of forming an outer electrode including,*

(*a*) a step of positioning said semiconductor substrate in a first position;

(*b*) a step of implanting ions into a first side-wall of said side-walls of said trench from a direction inclined to a normal to a plane containing said principal surface of said semiconductor substrate;

(*c*) a step of positioning said semiconductor substrate in a second position which is different from said first position by rotating said semiconductor substrate by 90° about an axis of rotation which is perpendicular to said principal surface of said semiconductor substrate;

(*d*) a step of implanting ions of the same type and to the same extent as implanted in the first side-wall into a second side-wall of said side-walls of said trench from said direction inclined to the normal to the plane containing said principal surface of said semiconductor substrate;

(*e*) a step of positioning said semiconductor substrate in a third position which is different from said first and second positions by rotating said semiconductor substrate by 90° about said rotation axis;

(*f*) a step of implanting ions of the same type and to the same extent as implanted in said first and second side-walls into a third side-wall of said side-walls of said trench from said direction inclined to the normal to the plane containing said principal surface of said semiconductor substrate;

(*g*) a step of positioning said semiconductor substrate in a fourth position which is different from said first, second and third positions by rotating said semiconductor substrate by 90° about said rotation axis;

(*h*) a step of implanting ions of the same type and to the same extent implanted in said first, second and third side-walls into a fourth side-wall of said side-walls of said trench from said direction inclined to the normal to the plane containing said principal surface of said semiconductor substrate;

[a step of implanting ions into the bottom of the trench by emitting ion beams of the same type as implanted in the side-walls in a direction perpendicular to said principal surface is said semiconductor device; and] *wherein* all of the steps of implanting [being] *are* carried out such that the extent of implantation and type of ion [of] *are* such that [a trench capacitor] *an outer electrode* is thereby formed *along said four side-walls of said trench;*

*a step of forming an insulating layer within the trench along the outer electrode; and*

*a step of forming an inner electrode within the trench along the insulative layer.*

3. A method of fabricating a semiconductor device comprising:

a step of forming a trench in a semiconductor substrate having a principal surface, said trench having four side-walls which extend into said substrate in a direction [substantially] perpendicular to said principal surface of said semiconductor substrate and which are perpendicular to each other, and said trench having a bottom [substantially] parallel to said principal surface;

a step of positioning said semiconductor substrate in a first position;

a step of implanting ions into a first side-wall of said side-walls of said trench from a direction inclined to a normal to a plane containing said principal surface of said semiconductor substrate;

a step of positioning said semiconductor substrate in a second position which is different from said first position by moving said semiconductor substrate;

a step of implanting ions of the same type and to the same extent as implanted in the first side-wall into a second side-wall of said side-walls of said trench from said direction inclined to the normal to the plane containing said principal surface of said semiconductor substrate;

a step of positioning said semiconductor substrate in a third position which is different from said first and second positions by moving said semiconductor substrate;

a step of implanting ions of the same type and to the same extent as implanted in said first and second side-walls into a third side-wall of said side-walls of said trench from said direction inclined to the normal to the plane containing said principal surface of said semiconductor substrate;

a step of positioning said semiconductor substrate in a fourth position which is different from said first, second and third positions by moving said semiconductor substrate;

a step of implanting ions of the same type and to the same extent implanted in said first, second and third side-walls into a fourth side-wall of said side-walls of said trench from said direction inclined to the normal to the plane containing said principal surface of said semiconductor substrate; and a step of implanting ions into the bottom of the trench by emitting ion beams of the same type as implanted in the side-walls in a direction perpendicular to said principal surface of said semiconductor device;

wherein in said second position said side-walls of said trench are oriented at right angles to the positions of said side-walls in the first position, in said third position said side-walls of said trench are oriented parallel to the positions of said side-walls in the first position, and in said fourth position said side-walls are oriented parallel to said side-walls in the second position.

* * * * *